(12) United States Patent
Moriguchi

(10) Patent No.: US 6,768,188 B2
(45) Date of Patent: Jul. 27, 2004

(54) SEMICONDUCTOR DEVICE

(75) Inventor: Koji Moriguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/464,752

(22) Filed: Jun. 19, 2003

(65) Prior Publication Data

US 2004/0056362 A1 Mar. 25, 2004

(30) Foreign Application Priority Data

Sep. 19, 2002 (JP) ........................................ 2002-273839

(51) Int. Cl.[7] .............................................. H01L 23/495
(52) U.S. Cl. ........................ 257/676; 257/735; 257/666; 361/813
(58) Field of Search ................................. 361/764, 772, 361/773, 774, 791, 813; 257/690, 735, 773, 666, 669, 693, 676

(56) References Cited

U.S. PATENT DOCUMENTS

| 4,935,803 | A | | 6/1990 | Kalfus et al. | |
| 5,001,545 | A | * | 3/1991 | Kalfus et al. | 257/773 |
| 5,110,761 | A | | 5/1992 | Kalfus et al. | |
| 6,040,626 | A | * | 3/2000 | Cheah et al. | 257/735 |
| 6,396,127 | B1 | * | 5/2002 | Munoz et al. | 257/666 |
| 6,459,147 | B1 | * | 10/2002 | Crowley et al. | 257/692 |
| 6,566,164 | B1 | * | 5/2003 | Glenn et al. | 438/107 |

* cited by examiner

Primary Examiner—Kamand Cuneo
Assistant Examiner—Thanh Y. Tran
(74) Attorney, Agent, or Firm—Oblon, Spivak, McClelland, Maier & Neustadt, P.C.

(57) ABSTRACT

There is provided a semiconductor device in a package structure that can improve reliability. The semiconductor device comprises a semiconductor chip having an upper electrode and a lower electrode formed thereon; a package base bonded to the lower electrode on the semiconductor chip; and a metallic strap having first and second ends bonded through solders to the upper electrode on the semiconductor chip and a package lead. The first end of the metallic strap is bonded to the upper electrode in such a manner that a gap therebetween gradually becomes wider in a portion close to the semiconductor chip's edge toward said second end of said metallic strap.

7 Claims, 4 Drawing Sheets

SEMICONDUCTOR DEVICE

CROSS-REFERENCE TO PRIOR APPLICATION

This application is based upon and claims the benefit of priority from the prior Japanese Patent Application No. 2002-273839, filed on Sep. 19, 2002, the entire content of which is incorporated herein by reference.

BACKGROUND OF THE INVENTION

1. Field of the Invention

The present invention relates to a semiconductor device, in particular to a package structure for a semiconductor chip.

2. Description of the Related Art

The widespread use of compact electronics devices such as cell phones requires downsizing of semiconductor devices for power control such as power transistors and rectifiers. Lead frames are generally employed as packages for these downsized semiconductor devices. A semiconductor device mounted on a die-pad of the lead frame has an upper electrode, which is connected to an inner lead via a boding wire.

If the upper electrode on the semiconductor device is a source electrode (or drain electrode) that is a current terminal electrode of a transistor, or a cathode electrode (or anode electrode) of a diode, a plurality of bonding wires may often be connected to flow a large capacity of current.

To the contrary, the Applicant has proposed a method of connecting an upper electrode on a device to an inner lead using a plate-like metallic lead (metallic strap) instead of the bonding wire. The lead has lower thermal and electrical resistances than those of the bonding wire (see Japanese Patent Application Laid-Open No. 2002-100716).

A method of ultrasonic die boding or a method of soldering is employed to bond the semiconductor device to the inner lead via the metallic strap. The former is advantageous in production because it can easily rationalize manufacturing facilities. In contrast, the latter is advantageous in wiring resistance and thermal radiation. In particular, the latter is employed frequently in middle- and low-capacity power semiconductor devices.

On the other hand, to meet the needs for downsizing and thinning of a semiconductor device package, it is preferable to lay the metallic strap to the lead in parallel with the semiconductor chip. Such a package structure is exemplified in FIG. 11. A semiconductor chip 21 is mounted on a die-pad 22 via a solder 31. A metallic strap 24 is connected to an upper electrode on the semiconductor chip 21 and to a lead 23 via solders 32 and 33. This semiconductor device is then molded in a resin 34.

When the metallic strap 24 is soldered as shown in FIG. 11, the solder 32 may project outside the upper electrode at the periphery of the semiconductor chip 21 (in particular, at the terminal thereof at the side of the lead 23 for laying the upper electrode out, as indicated by the arrow shown in FIG. 11). In such the case, a problem arises on reliability. At the periphery of the semiconductor chip 21A, dicing lines for chip isolation are located but no insulator film exists. Therefore, if the solder crawls to the periphery, a p-n junction may be short-circuited, for example.

Even though the solder does not extend to the terminal of the chip, a problem also arises if the solder runs on the insulator outside the upper electrode. When a reverse bias is applied to the semiconductor device, a depletion layer is extended to the periphery of the chip. In this case, when a high voltage is applied to a soldered portion above the depletion layer, the depletion layer further reaches the chip's end portion due to the field plate effect. This situation lowers the breakdown voltage of the semiconductor device, for example.

If the metallic strap is flat, it causes a problem on thermal stress because a layer of solder between the metallic strap and the semiconductor chip is thinned. For example, if a large current flows in a high temperature environment, a large thermal stress strain occurs in the semiconductor chip due to a difference in thermal expansion coefficient between the semiconductor chip and the metallic strap and deteriorates the device characteristic. In a word, a sufficient thermal resistance can not be achieved.

The present invention has an object to provide a semiconductor device in a package structure that can improve reliability.

SUMMARY OF THE INVENTION

According to the present invention, a semiconductor device comprises a semiconductor chip having an upper electrode and a lower electrode formed thereon; a package base bonded to the lower electrode on the semiconductor chip; and a metallic strap having first and second ends, said first ends being bonded via a solder to said upper electrode on said semiconductor chip, said second end being bonded to a package lead. The first end of the metallic strap is bonded to the upper electrode in such a manner that a gap therebetween gradually becomes wider in a portion close to said semiconductor chip's edge toward said second end of said metallic strap.

BRIEF DESCRIPTION OF THE DRAWINGS

The present invention will be more fully understood from the following detailed description with reference to the accompanying drawings, in which.

DETAILED DESCRIPTION OF THE EMBODIMENTS

Embodiments of the present invention will be described below with reference to the drawings.

Figure 1:
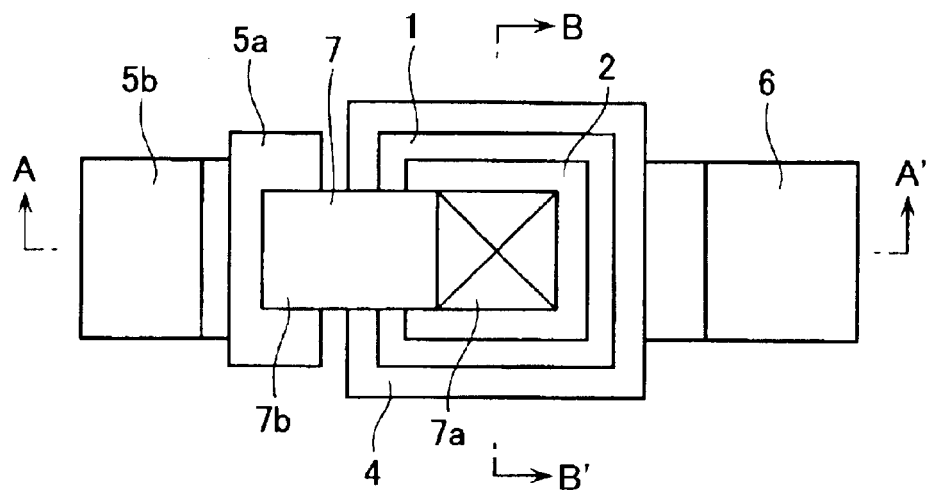
FIG. 1 is a plan view showing a semiconductor chip mounted on a lead frame according to an embodiment of the present invention.
Figure 2:
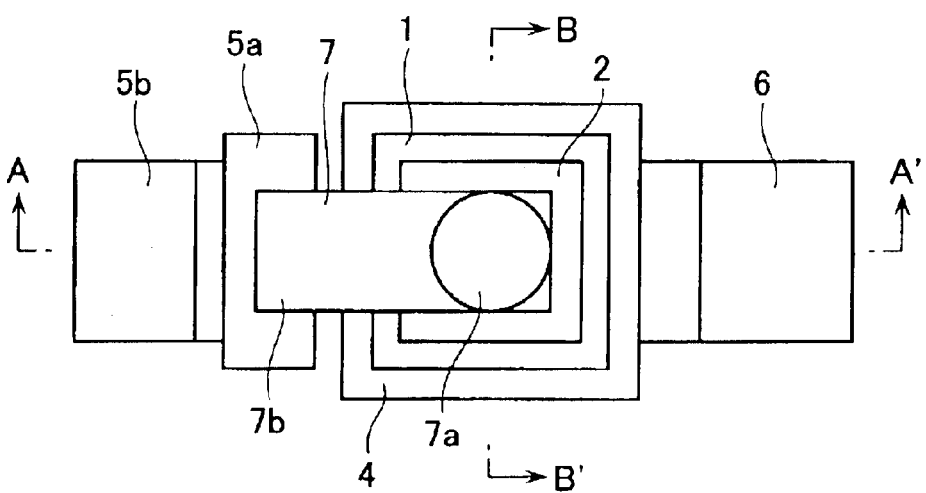
FIG. 2 is a plan view showing a semiconductor chip mounted on a lead frame according to another embodiment of the present invention.
Figure 3:
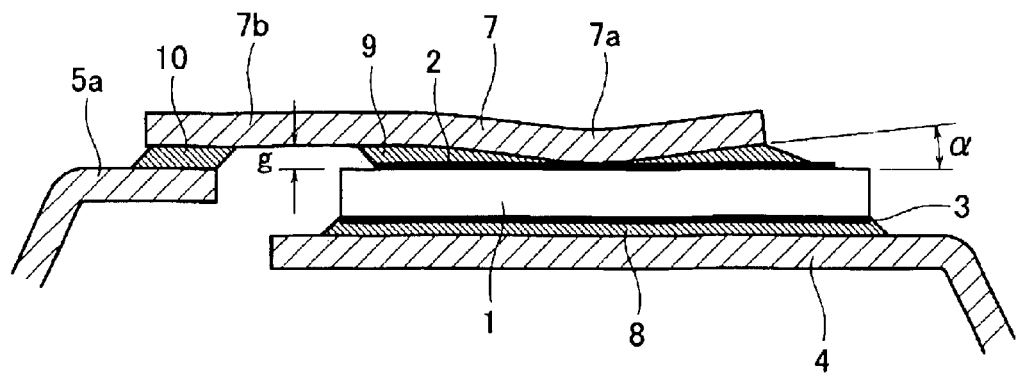
FIG. 3 is a cross-sectional view taken along the A—A' line in FIGS. 1 and 2.
Figure 4:
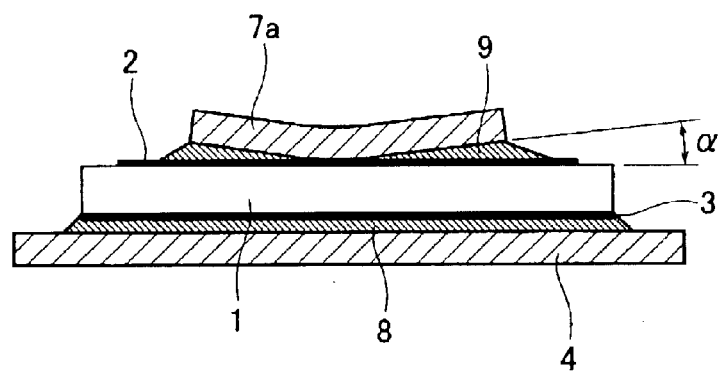
FIG. 4 is a cross-sectional view taken along the B—B' line in FIGS. 1 and 2.

FIG. 1 is a plan view showing a semiconductor chip 1 mounted on a lead frame according to an embodiment. FIG. 2 is a plan view showing a semiconductor chip 1 mounted on a lead frame according to another embodiment. FIGS. 3 and 4 show A—A' and B—B' cross-sections in FIGS. 1 and 2.

The semiconductor chip 1 in these examples is a diode. It has an upper electrode 2 and a lower electrode 3 formed on both surfaces; one of them serves as an anode and the other a cathode. The lower electrode 3 on the semiconductor chip 1 is bonded to a package base or die-pad 4 via a solder 8. A lead 5 is employed as an external terminal of the upper electrode 2. An inner lead 5a of the lead is bent upward from an outer lead 5b thereof so that the upper surface position of the former is almost coincident with the upper surface of the semiconductor chip 1. A metallic strap (metallic plate) 7 is connected between the upper electrode 2 and the inner lead 5a.

The metallic strap 7 has a thickness of about 150 μm. The metallic strap 7 has a first end 7a bonded to the upper electrode 2 via a solder 9 and a second end 7b similarly bonded to the inner lead 5a via a solder 10.

The first end 7a of the metallic strap 7 has a pyramidal (square pyramidal) shape with a vertical angle facing the semiconductor chip 1 in the case of FIG. 1. It has a conical shape with a vertical angle facing the semiconductor chip 1 in the case of FIG. 2. These vertical angles of the pyramid and cone are determined within 90–170°, more preferably 160–170°. As a result, the surface of the upper electrode on the semiconductor chip 1 is tilted at an angle of α from and bonded to the opposite surface of the first end 7a of the metallic strap 7 as shown in FIGS. 3 and 4. The angle a may be determined within 5–45°, preferably 5–10°.

In other words, the first end 7a of the metallic strap 7 and the upper electrode 2 have a gap therebetween, which gradually becomes wider toward the periphery of the chip 1 apart from an apex of the cone or pyramid. They are soldered at the periphery (particularly the chip edge at the second end 7b of the metallic strap 7) to ensure a certain gap of g. The melted solder 9 extends to the chip periphery during soldering while the presence of the gap g prevents it from projecting outside the upper electrode 2.

As a result, it is possible to achieve high reliability without a short-circuited pn junction and a lowered breakdown voltage caused by the solder projected outside the upper electrode as in the art. In comparison with the flat metallic strap, a layer of solder can reside much between the metallic strap 7 and the semiconductor chip 1, improving the bonding condition of the metallic strap 7. In addition, the layer of solder buffers the thermal stress. Accordingly, the heat resistivity of the device can be improved.

Figure 5:
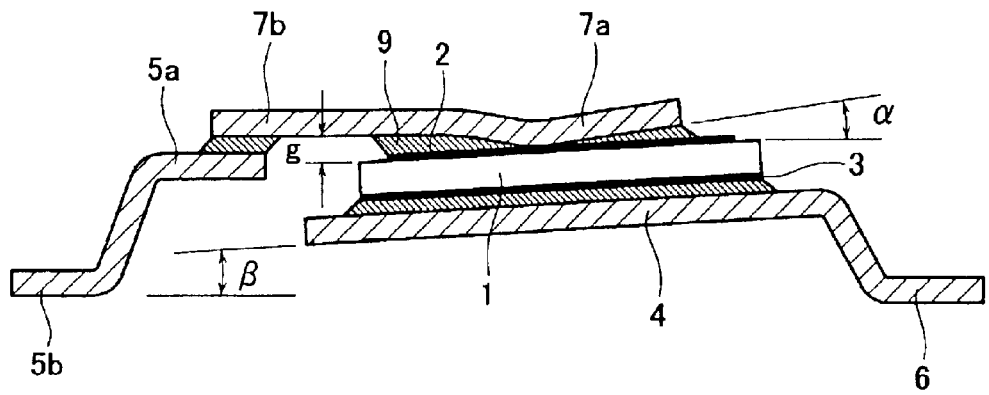
FIG. 5 is a plan view showing a semiconductor chip mounted on a lead frame according to another embodiment of the present invention.

FIG. 5 shows a chip in a mounted state according to another embodiment corresponding to FIG. 3. A metallic strap 7 has a first end 7a shaped pyramidal or conical similar to the preceding embodiment. In the present embodiment, a die-pad 4 of a lead frame is tilted at an angle of β to the package lead plane (the surface of outer leads 5b, 6) so that the side facing the inner lead 5a, to which the upper electrode 2 is lead, is made lower. The angle β may be determined within 5–45°, preferably 5–10°.

This allows a gap g between the semiconductor chip 1 and the metallic strap 7 to be held reliably at the side facing the inner lead 5a.

Figure 6:
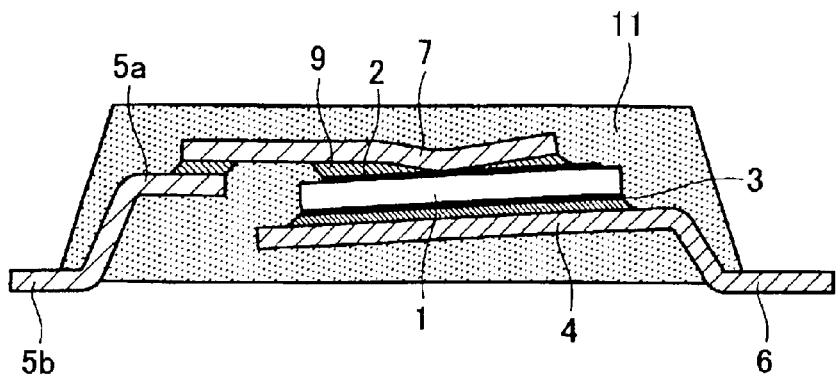
FIG. 6 is a cross-sectional view showing the device of FIG. 5 molded in a resin.

FIG. 6 shows the entire part of FIG. 5 finally molded in a resin 11. The conical or pyramidal shape of the metallic strap 7 has a sufficiently large vertical angle. In addition, the die-pad 4 tilts slightly. These are effective to thin the sealed package.

Figure 7:
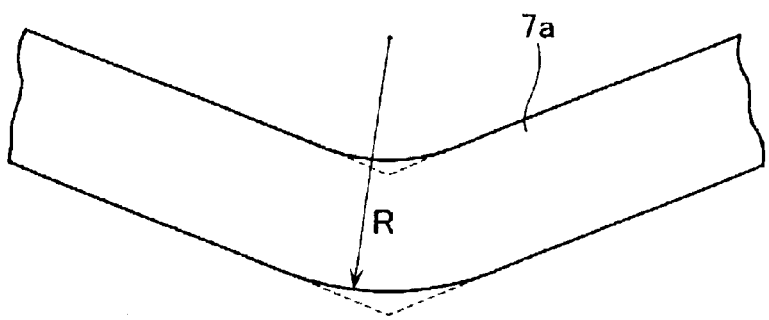
FIG. 7 is a cross-sectional view showing another preferable shape of the metallic strap.

In the above embodiment, as for the conical or pyramidal shape of the first end 7a of the metallic strap 7, more preferably, the apex is not sharpened but rounded as shown in FIG. 7. In this case, the radius of curvature, R, at a curved surface of the apex is determined R=about 50–150 μm, for example. This is effective to prevent mechanical stress from concentrating on and causing damage to the semiconductor chip when the metallic strap is bonded to the semiconductor chip.

Figure 8:
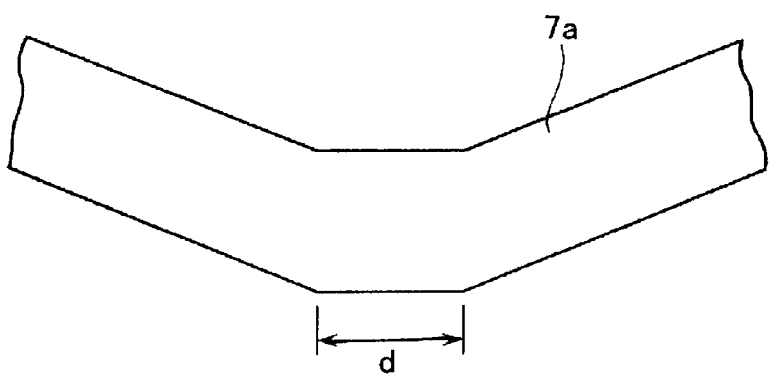
FIG. 8 is a cross-sectional view showing another preferable shape of the metallic strap.

FIG. 8 shows an example of the first end 7a of the metallic strap 7, of which conical or pyramidal shape is not sharpened but flattened over a slight range d to form a conical or pyramidal mesa shape. This is based on the same purpose as of the example in FIG. 7. This is also effective to prevent mechanical stress from concentrating on and causing damage to the semiconductor chip when the metallic strap is bonded to the semiconductor chip.

Figure 9A:
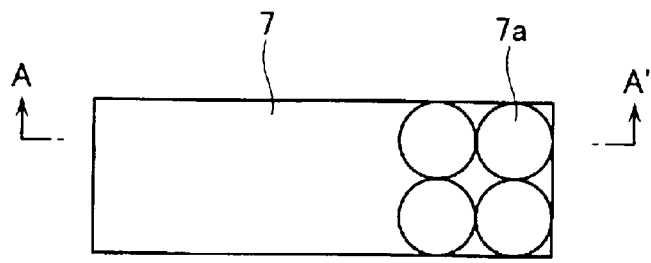
FIGS. 9A and 9B show another preferable shape of the metallic strap in a plan view and a cross-sectional view.
Figure 9B:
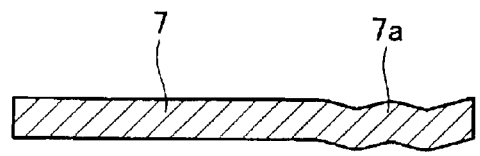

FIGS. 9A and 9B show a metallic strap 7 according to a further embodiment in a plan view and its A—A' cross-sectional view. In this example, plural conical shapes (four conical shapes in the figure) are formed on a first end 7a of a metallic strap 7, which end is connected to the chip. Plural pyramidal shapes can be formed similarly. This is also effective like the preceding embodiments.

Figure 10:
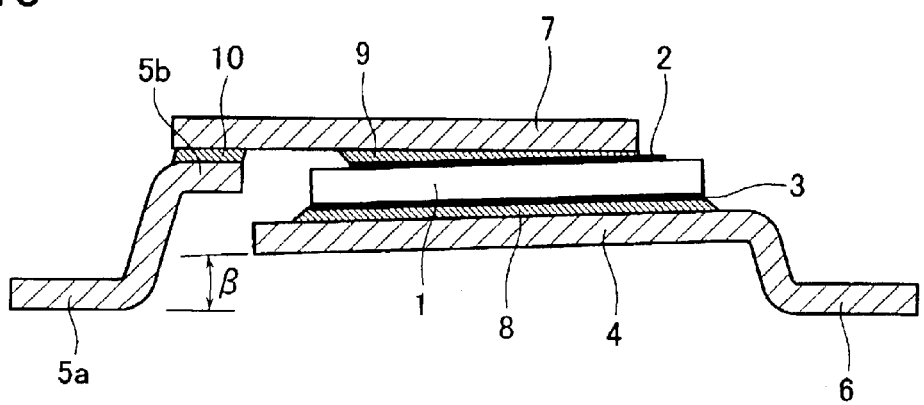
FIG. 10 is a cross-sectional view showing a semiconductor chip mounted on a lead frame according to another embodiment of the present invention.
Figure 11:
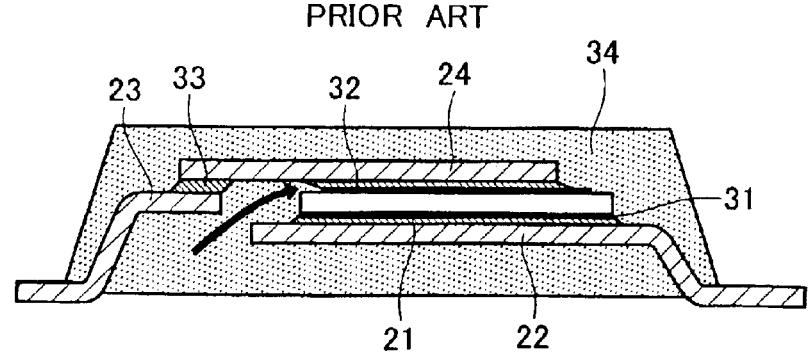
FIG. 11 is a cross-sectional view showing a package structure for a semiconductor chip in the art.

FIG. 10 shows a semiconductor chip in a mounted state according to a yet further embodiment corresponding to FIG. 3 or 7. In this embodiment, a metallic strap 7 is a flat plate having no conical or pyramidal shape. A die-pad 4 is tilted to the lead plane at an angle of β similar to FIG. 5. A semiconductor chip 1 is kept parallel with and mounted on the die-pad 4. The metallic strap 7 is kept parallel with leads 5, 6 and bonded to an upper electrode 2 on the semiconductor chip 1. In this case, a gap between the metallic strap 7 and the semiconductor chip 1 becomes wider at a location closer to the lead 5. Therefore, it is possible to prevent the solder 9 from projecting outside the upper electrode 2 at the side of the lead 5. Accordingly, without the use of the conical or pyramidal shape, the same effect as those of the preceding embodiments can be achieved.

The semiconductor device is exemplified as a diode in the preceding embodiments while the present invention is also applicable to vertical power transistors. In a vertical transistor, the upper and lower electrodes described in the embodiments correspond to source and drain electrodes or emitter and collector electrodes. In addition, a control electrode pad is arranged on the upper surface of the chip and connected to a gate or base electrode. A bonding wire or a metallic strap is employed to connect the control electrode pad to the corresponding pad.

The package described in the preceding embodiments is of a lead frame type while the present invention is also applicable to other package structures having a base (bed) corresponding to the die-pad and a lead terminal.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor device, comprising:
   a semiconductor chip having an upper electrode and a lower electrode formed thereon;
   a package base bonded to said lower electrode on said semiconductor chip; and
   a metallic strap having first and second ends, said first ends being bonded via a solder to said upper electrode on said semiconductor chip, said second end being bonded to a package lead, wherein said first end of said metallic strap is bonded to said upper electrode in such a manner that a gap therebetween gradually becomes wider in a portion close to said semiconductor chip's edge toward said second end of said metallic strap, and wherein said first end of said metallic strap has a conical shape with a vertical angle toward said semiconductor chip.

2. The semiconductor device as recited in claim 1, wherein said conical shape has a rounded apex.

3. The semiconductor device as recited in claim 1, wherein said pyramidal shape has a rounded apex.

4. The semiconductor device as recited in claim 1, wherein said vertical angle is determined within 9–170°.

5. The semiconductor device as recited in claim 1, wherein said package base is tilted to a package lead plane in such a manner that one side of the package base toward said package lead is lowered than the other.

6. The semiconductor device as recited in claim 1, wherein said package base is tilted to said package lead plane in such a manner that one side of the package base toward a package lead is lowered than the other.

7. A semiconductor device, comprising:

a semiconductor chip having an upper electrode and a lower electrode formed thereon;

a package base bonded to said lower electrode on said semiconductor chip; and a metallic strap having first and second ends, said first ends being bonded via a solder to said upper electrode on said semiconductor chip, said second end being bonded to a package lead, wherein said first end of said metallic strap is bonded to said upper electrode in such a manner that a gap therebetween gradually becomes wider in a portion close to said semiconductor chip's edge toward said second end of said metallic strap, and wherein said first end of said metallic strap has a pyramidal shape with a vertical angle toward said semiconductor chip.

* * * * *